(12) United States Patent
Gustafsson et al.

(10) Patent No.: US 8,791,829 B2
(45) Date of Patent: Jul. 29, 2014

(54) VISUALISATION ARRANGEMENT

(75) Inventors: Anton Gustafsson, Eskilstuna (SE);
Magnus Gyllensward, Stockholm (SE);
Christina Öhman, Saltsjö-Boo (SE);
Sara Ilstedt-Hjelm, Lidingö (SE)

(73) Assignee: The Interactive Institute II AB, Stockholm (SE)

( * ) Notice: Subject to any disclaimer, the term of this patent is extended or adjusted under 35 U.S.C. 154(b) by 1768 days.

(21) Appl. No.: 11/885,697

(22) PCT Filed: Mar. 6, 2006

(86) PCT No.: PCT/SE2006/000283
§ 371 (c)(1),
(2), (4) Date: Oct. 3, 2007

(87) PCT Pub. No.: WO2006/096115
PCT Pub. Date: Sep. 14, 2006

(65) Prior Publication Data
US 2008/0191890 A1      Aug. 14, 2008

(30) Foreign Application Priority Data
Mar. 7, 2005  (SE) .................................... 0500523

(51) Int. Cl.
| G08B 21/00 | (2006.01) |
| G08B 13/12 | (2006.01) |
| G02B 6/44  | (2006.01) |
| H01R 13/648 | (2006.01) |
| G05F 1/00  | (2006.01) |
| F21V 9/16  | (2006.01) |

(52) U.S. Cl.
USPC ............... 340/635; 340/854.6; 340/854.9; 340/568.2; 385/901; 385/102; 439/101; 439/102; 315/313; 315/312; 315/315; 362/84; 362/319; 362/186

(58) Field of Classification Search
None
See application file for complete search history.

(56) References Cited

U.S. PATENT DOCUMENTS

| 3,819,973 A  * | 6/1974 | Hosford ........................ 313/498 |
| 5,122,733 A    | 6/1992 | Havel |
| 5,485,355 A    | 1/1996 | Voskoboinik et al. |
| 6,169,491 B1   | 1/2001 | McDonald |
| 6,347,172 B1   | 2/2002 | Keller et al. |
| 6,377,054 B1   | 4/2002 | Beha |
| 6,742,909 B2 * | 6/2004 | Conti et al. ..................... 362/84 |
| 6,758,314 B2 * | 7/2004 | Woodruff ................. 191/12.2 R |

(Continued)

FOREIGN PATENT DOCUMENTS

| WO | WO 03/093394 A1 | 11/2003 |
| WO | WO 03/105538 A1 | 12/2003 |

OTHER PUBLICATIONS

International Search Report for PCT/SE2006/000283, mailed Jun. 4, 2006.

*Primary Examiner* — Fekadeselassie Girma
(74) *Attorney, Agent, or Firm* — Patent Portfolio Builders PLLC

(57) ABSTRACT

The present invention relates to a method and an arrangement for visual indication of an electrical quantity, being one or several of power, current and/or voltage through a conductor. The arrangement comprises a substantially wire shaped illuminator and a controller which controls at least one illumination characteristic of said illuminator with respect to said electrical feature.

17 Claims, 3 Drawing Sheets

(56) References Cited

U.S. PATENT DOCUMENTS

| | | | |
|---|---|---|---|
| 7,068,893 B2* | 6/2006 | Oh et al. | 385/101 |
| 7,195,561 B2* | 3/2007 | Hussaini et al. | 463/31 |
| 7,270,442 B2* | 9/2007 | Davenport et al. | 362/276 |
| 7,324,006 B2* | 1/2008 | Godard | 340/664 |
| 7,401,961 B2* | 7/2008 | Longatti et al. | 362/551 |
| 2002/0039666 A1 | 4/2002 | Nakamura | |
| 2004/0067387 A1 | 4/2004 | Kim et al. | |
| 2005/0037233 A1 | 2/2005 | Dobbs et al. | |
| 2005/0040954 A1* | 2/2005 | McNally | 340/573.3 |
| 2005/0057942 A1* | 3/2005 | Mako et al. | 362/554 |
| 2005/0141237 A1* | 6/2005 | Goto | 362/555 |
| 2006/0291136 A1* | 12/2006 | Okishima | 361/289 |

\* cited by examiner

VISUALISATION ARRANGEMENT

This application claims priority and benefit from International Application No. PCT/SE2006/000283, filed Mar. 6, 2006, which claims priority to Swedish patent application No. 0500523-6, filed Mar. 7, 2005, the entire teachings of which are incorporated herein by reference.

TECHNICAL FIELD OF THE INVENTION

The present invention relates to a visualisation arrangement, especially formed as a cable or wire surrounding, for visualisation of current and/or power consumption.

BACKGROUND OF THE INVENTION

Electricity is an invisible phenomenon. Usually, the state of the electrical equipment is indicated using some form of illuminator such as LEDs arranged in a housing. The light from the illuminator indicates whether the equipment is on or off.

U.S. Pat. No. 6,347,172 describes an optically observable cable and a method of manufacturing the same. The optically observable cable includes a conduit for conducting signals and a side-emitting optical fiber disposed on a periphery of the conduit and extending along a length of the conduit, and a cable jacket encapsulating the conduit and the side-emitting optical fiber, wherein the cable jacket is at least partially translucent such that the side-emitting optical fiber is optically exposed through the cable jacket. A method of detecting individual cables from amongst a plurality of signal transmission cables each having a side-emitting optical fiber includes positioning a light source at an interface which houses and end of a cable to be detected, transmitting light from the light source into the interface, and observing light emitted from an axis of a cable to be detected. This invention aims to solve the problem of identifying different cables in a large number of cable structures.

In the prior art, materials emitting light when an electric current passes through them are well known and used in a wide range of display applications. Typical electroluminescent devices comprise an anode, normally of an electrically light transmitting material, a layer of a hole transporting material, a layer of the electroluminescent material, optionally a layer of an electron transmitting material and a metal cathode. There can be other layers, such as buffer layers and the layers can be combined using mixtures of one or more of the hole transporting material, electroluminescent material and the electron transmitting material.

For example, WO 03/093394 relates to an electroluminescent device having a layer which emits light in the blue, purple/blue or ultraviolet section of the spectrum and a layer which contains a fluorescent material and optionally a layer comprising one or more color filters so that light emitted by the electroluminescent layer excites the fluorescent material causing light to be emitted at a longer wavelength.

US 2002/0039666 relates to an electric luminescence fiber, which can be maintained in any desired shape and can be used in wider applications. The invention provides a flexible luminescence substance produced by arranging electrode wires in electric luminescence powder, said electric luminescence substance is coated with thermoplastic resin, thermosetting resin, or UV-setting resin. The coated resin is hardened and stabilized in linear or other desired shape, and the electric luminescence substance inside the coated resin is maintained in the desired shape.

SUMMARY OF THE INVENTION

The present invention provides a novel method and arrangement for indicating the level of current and/or power consumption of one or several apparatuses. Mainly, the invention provides an arrangement and method for indicating the load a power cable is exposed to.

For these reasons, an arrangement is provided for visual indication of an electrical quantity, being one or several of power, current and/or voltage through a conductor. The arrangement comprises a substantially wire shaped illuminator and a controller which is adapted to control at least one illumination characteristic of the illuminator with respect to the electrical feature. Preferably, the wire shaped illuminator is arranged along the conductor. According to one embodiment, the wire shaped illuminator is electroluminescent. According to another embodiment, the wire shaped illuminator is an optical fibre.

Preferably, the controller is further adapted to measure the electrical quantity and adopt a control signal to control the illuminator. The controller may comprise a processing arrangement and a measuring arrangement and a driver for driving the illuminator receiving control signals from the processing arrangement.

According to preferred embodiments, the illumination feature is one or several of intensity, colour or frequency.

The invention also relates to a cord comprising at least one electric wire and an illuminating arrangement, at least partly arranged along extension of said electric wire, said illuminating arrangement having means for illumination when energized. The cord further comprising a substantially translucent coating, covering said wire and illuminating arrangement. According to one embodiment, the illuminating arrangement is electroluminescent wire. According to another embodiment the illuminating arrangement is an optical fibre. The illuminating arrangement indicates current and/or power consuming through said electric wire.

The invention also relates to a method of visually indicating an electrical quantity, being one or several of power, current and/or voltage through a conductor, the method comprising the steps of energizing a substantially wire shaped illuminator and controlling at least one illumination characteristic of said illuminator with respect to said electrical feature.

BRIEF DESCRIPTION OF THE DRAWINGS

In the following, the invention will be further described in a non-limiting way with reference to the accompanying drawings in which.

DETAILED DESCRIPTION OF THE EMBODIMENTS

Figure 1:
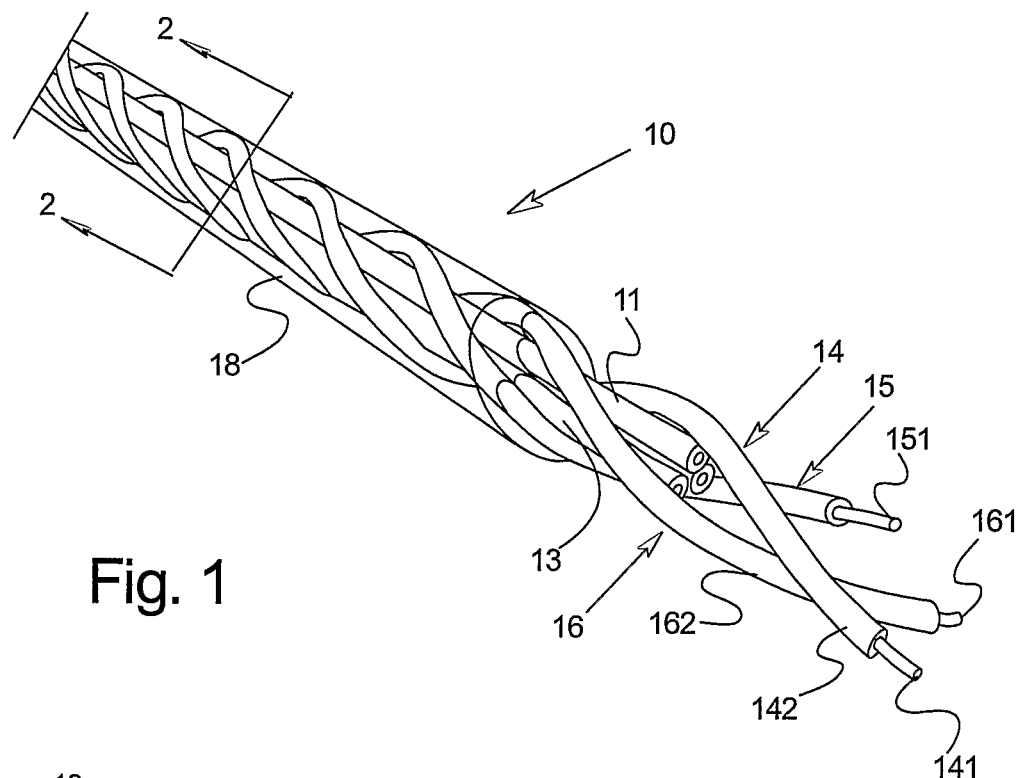
FIG. 1 schematically illustrates a part of an arrangement according to a preferred embodiment of the invention in perspective.
Figure 2:
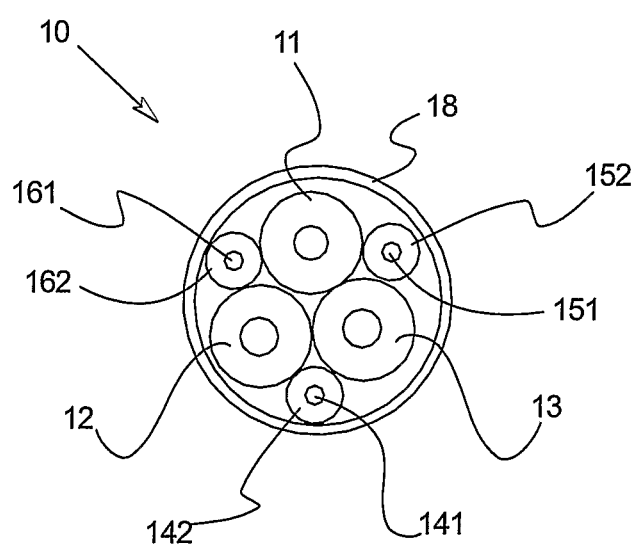
FIG. 2 is a cross sectional view through a cord arrangement of FIG. 1 along line 2-2.

FIGS. 1 and 2 illustrate an exemplary embodiment of the invention comprising a cord arrangement 10 including three ordinary electrical wires 11, 12 and 13 arranged around a centre axis. The electrical wires may extend parallel to the centre axis, as shown in FIG. 1, but may also be arranged in a twisted configuration around the centre axis. According to the present example, the three wires may be arranged as power, ground and neutral. The invention can be realised by twisting a number of illuminating wires 14, 15 and 16, which include conductors 141, 151 and 161 coated by an illuminating coating 142, 152 and 162, respectively.

The illuminating wires may be of the type known as electroluminescents, such as described in US 2005037233, WO 031/05538, US 2004067387, WO 03/093394, US 2002/0039666, U.S. Pat. No. 5,485,355 etc. The illuminating wires may also comprise of wires manufactured under trademark Lytec® by ELAM ltd.

The illuminating wires may also comprise optical fibres, preferably side-emitting optical fibres.

The twisted electrical wires and illuminating wires are covered by a light transparent or semi transparent coating 18, for example made of silicon, rubber etc.

It is appreciated by a skilled person that the present invention is not limited to three illuminating wires and the invention may be applied using any number of illuminating wires and/or electrical wires.

Figure 3:
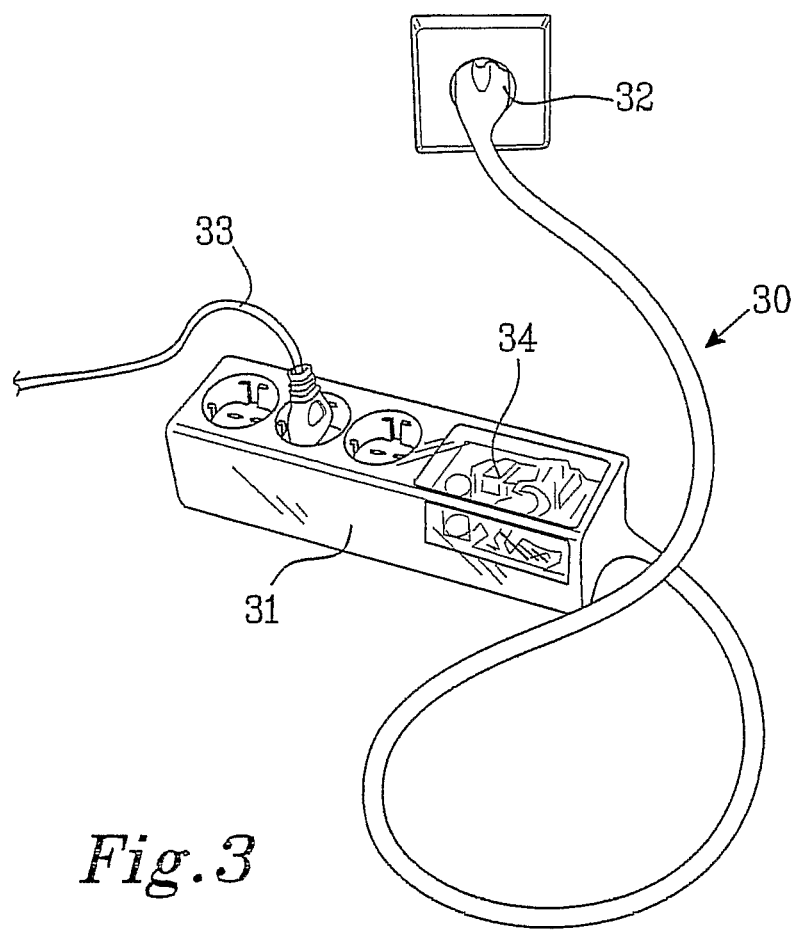
FIG. 3 is a schematic illustration of a cord, according to the invention, connected to a distributor.

FIG. 3 illustrates one application of the invention as a cord 30 of a distributor 31. The distributor 31 is connected to a wall socket 32. An electric equipment (not shown) is connected to the distributor through a plug 33. The cord is provided with the illuminating wires as mentioned earlier. It is also possible to provide the distributor and the wall plug itself with illuminating wires and consequently using them as part of the indicator.

The illuminating wires are connected to a controlling arrangement 34, in this case arranged inside the distributor.

Figure 4:
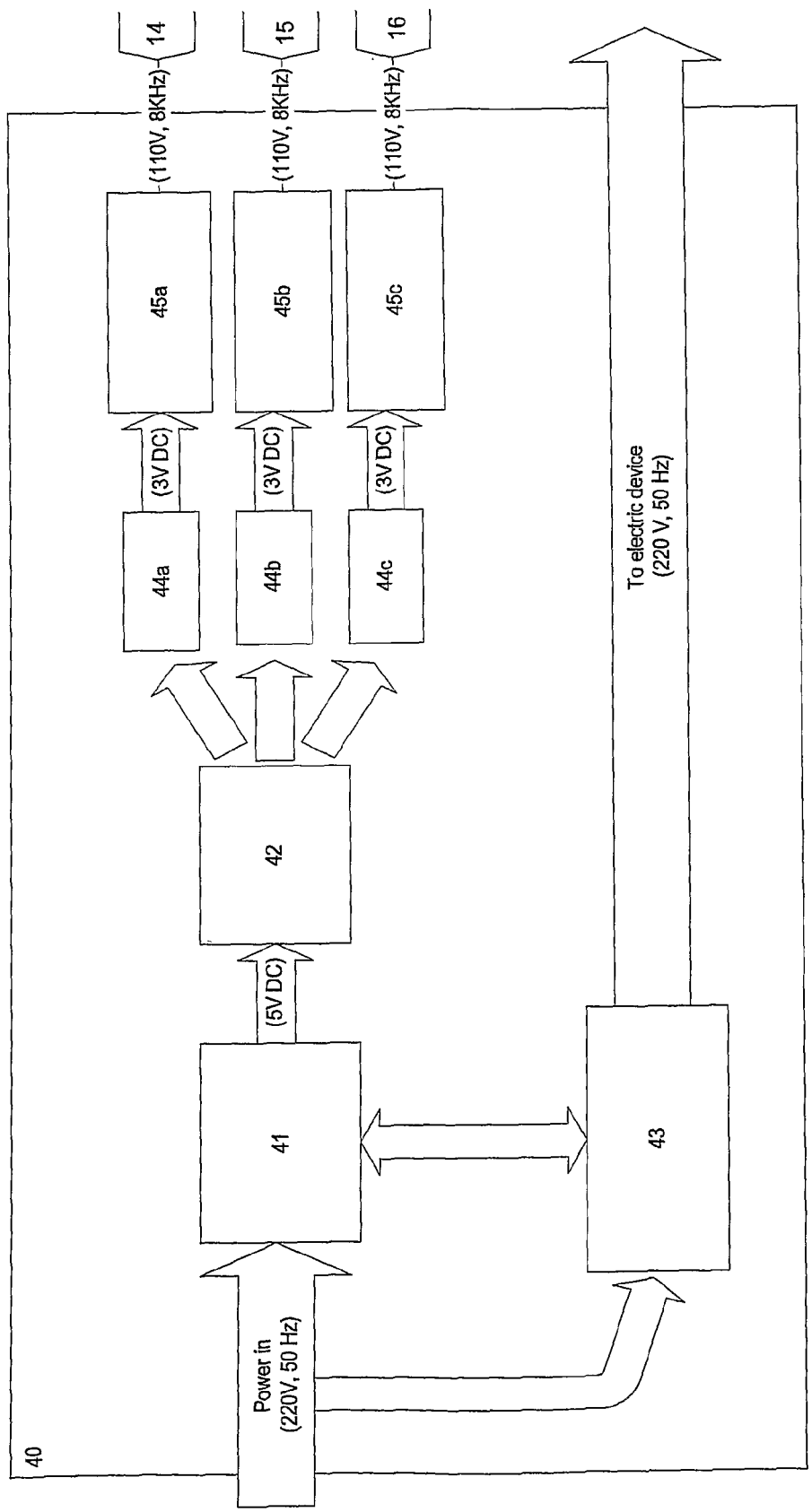
FIG. 4 is an exemplary block diagram of a controlling arrangement.

An exemplary controlling arrangement is described in the following in conjunction with the block diagram of FIG. 4.

Power to the controlling arrangement 40 is supplied through a power supply 41, which is connected to, for example, a wall socket through the cord 30. The power is adapted to the power level of the electronics in the controlling arrangement. The power supplier converts the power from AC to DC. A processing unit 42, such as a micro computer is arranged to process the information on power level or current amount received from a measuring arrangement 43.

The measuring arrangement 43 is arranged between the wall socket and before connection to an electric equipment so that the power and/or current consumption can be measured. The measuring arrangement may sample current and voltage cautiously and provide data to the micro computer. The power is product of current multiplied with voltage. In the event of stable voltage, the phase shift can be ignored and the current can be measured and used to approximate the power. Thus, the difference between the visualisation of current consumption and power consumption can be minimized.

The micro computer controls, in this example, three pulse width modulators (PWMs) 44a-44c for controlling analog circuits with a processor's digital outputs. The number of PWMs corresponds to the number of illuminating wires. The PWMs are connected to drivers 45a-45c, which operate in a suitable range, e.g. 0-110 V, 8 KHz. The illuminating wires are connected to the drivers and thus operate in the output range of the inverter modules. The drivers may be inverter modules.

In case of optical fibers, the drivers may be connected to intensity and/or pulse controlled light sources, such as light emitting diodes (LED) connected to one end of the fibers.

Depending on the current/voltage through the electrical wires, the micro computer will output suitable control signal to the drivers, which feeds the illuminating wires with varying current, voltage and frequency corresponding to the consumed current/voltage through the electrical wires.

In a preferred embodiment, the electroluminescent wires includes a central copper wire coated with a phosphorus material coating and two tiny transmitter wires wrapped around it, and covered by a PVC coating and finally a colored vinyl coat. The driver takes the voltage from a DC power source and inverts it to, e.g. 110 volts AC. When connected to a power source and driver, the charge creates a glow in the wire, e.g. very similar to neon.

Thus, the controlling arrangement controls the illuminating characteristics, e.g. intensity, color and/or pulsing (frequency) of the illuminating wires in relation to the consumed power and/or current through the electric wires. This allows obtaining a simultaneous characteristic change, shifting the pulsing in the wires to obtain visual effects such as flowing light, etc.

It should be appreciated by a skilled person that the aforementioned controlling arrangement, and input and output values are given as an example and other types of controlling arrangement operating with different electrical values may occur.

The invention is not limited to applications in cables and cords, especially distributor cords; the invention may likewise be applied in household appliance for providing visual indication of poser consumption of different appliances. In industrial and construction site applications, the visualization may be used for indicating overload. Especially, if many apparatuses are connected, it is possible to track a particular apparatus being overloaded or consuming high power by following the visually indicating cable. The visualization allows finding cables in limited sight situations.

The invention is not limited to the shown embodiments but can be varied in a number of ways without departing from the scope of the appended claims and the arrangement and the method can be implemented in various ways depending on application, functional units, needs and requirements etc.

The invention claimed is:

1. An arrangement for visual indication of an electrical quantity, being one or several of power, current or voltage through a conductor, wherein the arrangement comprises a substantially wire shaped illuminator and a controller for control at least one illumination characteristic of said wire shaped illuminator with respect to said electrical quantity by measuring the electrical quantity and feeding the wire shaped illuminator with varying current or voltage corresponding to the electrical quantity measured in the conductor.

2. The arrangement of claim 1, wherein said wire shaped illuminator is arranged along said conductor.

3. The arrangement of claim 1, wherein said wire shaped illuminator is electroluminescent.

4. The arrangement of claim 1, wherein said wire shaped illuminator is an optical fiber.

5. The arrangement of claim 1, wherein said controller further sends a control signal to control said wire shaped illuminator.

6. The arrangement of claim 3, wherein said electroluminescent includes a central conductive wire coated with a phosphorus material coating and transmitter wires wrapped around it, and covered by a coating and a colored vinyl coat.

7. The arrangement of claim 1, wherein said controller comprises a processing arrangement and a measuring arrangement and a driver for driving said wire shaped illuminator receiving control signals from said processing arrangement.

8. The arrangement of claim 1, wherein said illumination characteristic is one or several of intensity, color or frequency.

9. A cord comprises at least one electric wire and a substantially wire shaped illuminator at least partly arranged along an extension of said at least one electric wire, said substantially wire shaped illuminator having means for illumination when energized to indicate an electrical quantity, being one or several of power, current or voltage through the at least one electric wire, wherein said substantially wire shaped illuminator indicates the current or voltage through said at least one electric wire when at least one illumination characteristic of said substantially wire shaped illuminator is controlled with respect to said electrical quantity by feeding the substantially wire shaped illuminator with varying current or voltage corresponding to the current or voltage through at least one electrical wire.

10. The cord of claim 9, further comprising a substantially translucent coating, covering said at least one electric wire and substantially wire shaped illuminator.

11. The cord of claim 9, wherein said substantially wire shaped illuminator is an electroluminescent wire.

12. The cord of claim 9, wherein said substantially wire shaped illuminator is an optical fiber.

13. The cord of claim 9, wherein said substantially wire shaped illuminator indicates current or power through said at least one electric wire.

14. A method of visually indicating an electrical quantity, being one or several of power, current or voltage through a conductor, the method comprising the steps of:

energizing a substantially wire shaped illuminator and controlling at least one illumination characteristic of said substantially wire shaped illuminator with respect to said electrical quantity by measuring the electrical quantity and feeding the substantially wire shaped illuminator with varying current or voltage corresponding to the current or voltage through the conductor.

15. A device for providing a variable visual indication of consumption of electricity comprising:

a measurement unit, disposed between an external power source and a device which consumes said electricity, configured to measure a variable electrical quantity associated with said electricity; and a controller connected to said measurement unit and configured to receive said measured variable electrical quantity from said measurement unit, and further configured to control a plurality of illumination devices based on said received said measured variable electrical quantity;

wherein said plurality of illumination devices output light which varies over time as a function of said measured variable electrical quantity.

16. The device of claim 15, wherein said plurality of illumination devices each comprise a copper wire coated with a phosphorous material and two transmitter wires wrapped around the copper wire.

17. The device of claim 15, wherein said light output by said plurality of illumination devices varies in at least one of intensity, color or frequency over time based on said measured variable electrical quantity.

* * * * *